(12) United States Patent
Lin et al.

(10) Patent No.: US 8,492,221 B2
(45) Date of Patent: Jul. 23, 2013

(54) METHOD FOR FABRICATING POWER SEMICONDUCTOR DEVICE WITH SUPER JUNCTION STRUCTURE

(75) Inventors: Yung-Fa Lin, Hsinchu (TW); Shou-Yi Hsu, Hsinchu County (TW); Meng-Wei Wu, Hsinchu (TW); Chia-Hao Chang, Hsinchu (TW)

(73) Assignee: Anpec Electronics Corporation, Hsinchu Science, Hsin-Chu (TW)

( * ) Notice: Subject to any disclaimer, the term of this patent is extended or adjusted under 35 U.S.C. 154(b) by 0 days.

(21) Appl. No.: 13/433,282

(22) Filed: Mar. 28, 2012

(65) Prior Publication Data

US 2013/0164915 A1    Jun. 27, 2013

(30) Foreign Application Priority Data

Dec. 27, 2011    (TW) .............................. 100148861 A

(51) Int. Cl.
*H01L 21/8242*    (2006.01)
(52) U.S. Cl.
USPC ..... 438/247; 438/390; 438/524; 257/E21.337

(58) Field of Classification Search
USPC ............. 438/FOR. 435, FOR. 145, 373, 374, 438/375, 376, 377, 506, 514, 229, 231, 232, 438/233, 299, 301, 302, 306, 307, 364, 181, 438/401, 462, 975, FOR. 149, 243, 244, 246, 438/247, 386, 387, 389, 390, 689, 700, 524, 438/526, 965; 257/E21.248, 607, 610, 917, 257/397, 398, 396, 618, 622, 797, E29.346, 257/E21.334, E21.651, E21.337, 653, 288, 257/301
See application file for complete search history.

(56) References Cited

U.S. PATENT DOCUMENTS

| | | | |
|---|---|---|---|
| 5,442,214 A * | 8/1995 | Yang .............................. | 257/328 |
| 2011/0201161 A1* | 8/2011 | Ervin et al. .................... | 438/155 |
| 2011/0318895 A1* | 12/2011 | Tu et al. ......................... | 438/270 |

* cited by examiner

*Primary Examiner* — Thanh Y Tran
(74) *Attorney, Agent, or Firm* — Winston Hsu; Scott Margo

(57) ABSTRACT

A method for fabricating a power semiconductor device is provided. A substrate with a first conductivity type is prepared. A semiconductor layer with a second conductivity type is formed on the substrate. A hard mask pattern having at least an opening is formed on the semiconductor layer. A first trench etching is performed to form a first recess in the semiconductor layer via the opening. A first ion implantation is performed to vertically implant dopants into the bottom of the first recess via the opening, thereby forming a first doping region. A second trench etching is performed to etch through the first doping region, thereby forming a second recess.

10 Claims, 10 Drawing Sheets

METHOD FOR FABRICATING POWER SEMICONDUCTOR DEVICE WITH SUPER JUNCTION STRUCTURE

BACKGROUND OF THE INVENTION

1. Field of the Invention

The present invention relates generally to the field of power semiconductor devices and, more particularly, to a method for fabricating a super-junction power semiconductor device.

2. Description of the Prior Art

As known in the art, power semiconductor devices are mainly used in power management; for instance, in switching power supplies, in management integrated circuits in the core or peripheral regions of computers, in backlight power supplies, and in electric motor controls. This type of power semiconductor devices, as described above, includes an insulated gate bipolar transistor (IGBT), a metal-oxide-semiconductor field effect transistor (MOSFET), or a bipolar junction transistor (BJT), among which the MOSFET is the most widely utilized because of its energy saving properties and its ability to provide faster switch speed.

In one kind of power MOSFET device, a P-type epitaxial layer and an N-type epitaxial layer are alternatively disposed to form vertical PN junctions inside an array of a substrate structure, and the junctions are perpendicular to the surface of the substrate structure. A structure comprising said described PN junctions is called a vertical super-junction structure. In a conventional method for fabricating the super-junction structure, an epitaxial layer of a first conductivity type, e.g. N-type, is formed on a substrate of the first conductivity type. Then, a plurality of trenches are etched into the first conductivity type epitaxial layer. P type dopants are then implanted into the sidewalls of the trenches at oblique angles. After thermal drive-in process, a plurality of vertical PN junctions are formed, comprising a P type body doping region surrounding each of the trenches and the N type semiconductor layer.

The above-described prior art method has still several drawbacks. For instance, it is usually necessary to use the tilt-angle ion implantation for successfully implanting dopants into the sidewalls of the trenches. Typically, the ion implantation angle is no less than 7°. However, under such conditions, the dimensions of the trenches are limited and are not shrinkable. Therefore, the above-described prior art method is not suited for the manufacture of high aspect-ratio deep-trench type power devices. It is desirable to provide an improved method for fabricating super-junction power semiconductor devices that is capable of avoiding the aforesaid problem.

SUMMARY OF THE INVENTION

It is one objective of the present invention to provide an improved method for fabricating a super-junction power semiconductor device in order to overcome the shortcomings of the prior art.

According to one embodiment of the invention, a method for fabricating a power semiconductor device is provided. A substrate with a first conductivity type is prepared. A semiconductor layer with a second conductivity type is formed on the substrate. A hard mask pattern having at least an opening is formed on the semiconductor layer. A first trench etching is performed to form a first recess in the semiconductor layer via the opening. A first ion implantation is performed to vertically implant dopants into the bottom of the first recess via the opening, thereby forming a first doping region. A second trench etching is performed to etch through the first doping region, thereby forming a second recess.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. In the drawings:

FIGS. 1-10 are schematic diagrams illustrating a method for fabricating a super-junction power semiconductor device according to one embodiment of the invention, wherein:

FIGS. 1-5 illustrate the process of making the trench super junction structure;

FIGS. 6-8 illustrate the process of making the trench gate transistor; and

FIGS. 9-10 illustrate the process of making contact device.

Figure 1:
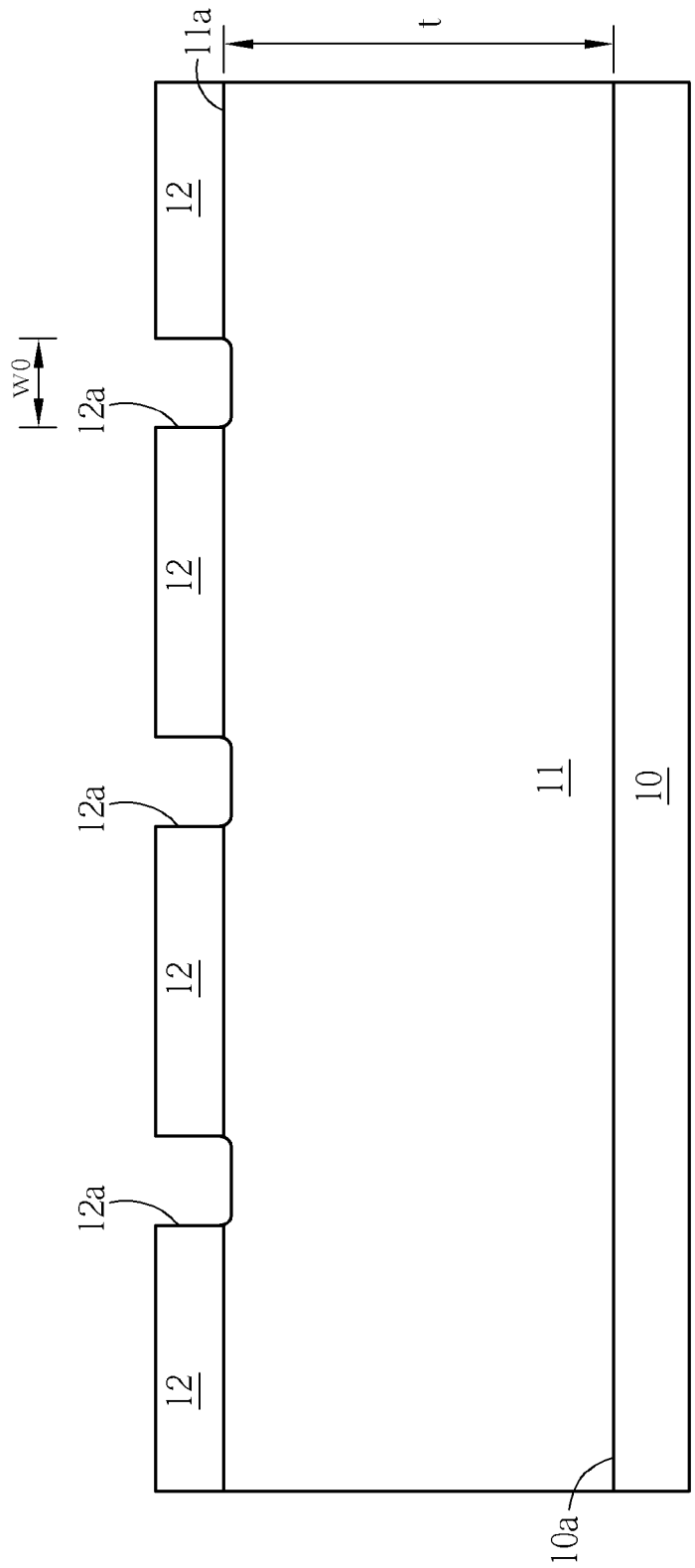

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following detailed description, reference is made to the accompanying drawings, which form a part hereof, and in which is shown by way of illustration specific examples in which the embodiments may be practiced. These embodiments are described in sufficient detail to enable those skilled in the art to practice them, and it is to be understood that other embodiments may be utilized and that structural, logical and electrical changes may be made without departing from the described embodiments. The following detailed description is, therefore, not to be taken in a limiting sense, and the included embodiments are defined by the appended claims.

The present invention pertains to a method for fabricating a power semiconductor device wherein etching and ion implant are performed alternatively and repeatedly to form a high-aspect ratio trench, and wherein the ion implant is performed vertically with respect to the main surface of the substrate. Without the intention of a limitation, the invention will now be described and illustrated with the reference to preferred embodiments. Although the trench gate MOS structure is illustrated, it is to be understood that the present invention may be applicable to the fabrication of other types of power semiconductor devices, for example, planar gate MOS structures.

FIGS. 1-10 are schematic diagrams illustrating a method for fabricating a super-junction power semiconductor device according to one embodiment of the invention. As shown in FIG. 1, a substrate or a semiconductor substrate 10, such as an $N^+$ silicon substrate, is prepared. A semiconductor layer 11, such as a P epitaxial silicon layer or an N epitaxial silicon layer, is formed on the main surface 10a of the semiconductor substrate 10. According to this embodiment, the semiconductor layer 11 is a P type semiconductor layer and has a thickness of about 40-50 μm, for example, 45 μm, but not limited thereto. Subsequently, a hard mask pattern 12 comprising an opening 12a is provided on the surface of the semiconductor layer 11. The opening 12a reveals a portion of the surface 11a of the semiconductor layer 11. The position and dimension of a deep trench to be etched into the semiconductor layer 11 is defined by the opening 12a. According to this embodiment, the opening 12a has a width $w_0$ of about 3 μm or less.

Figure 2:
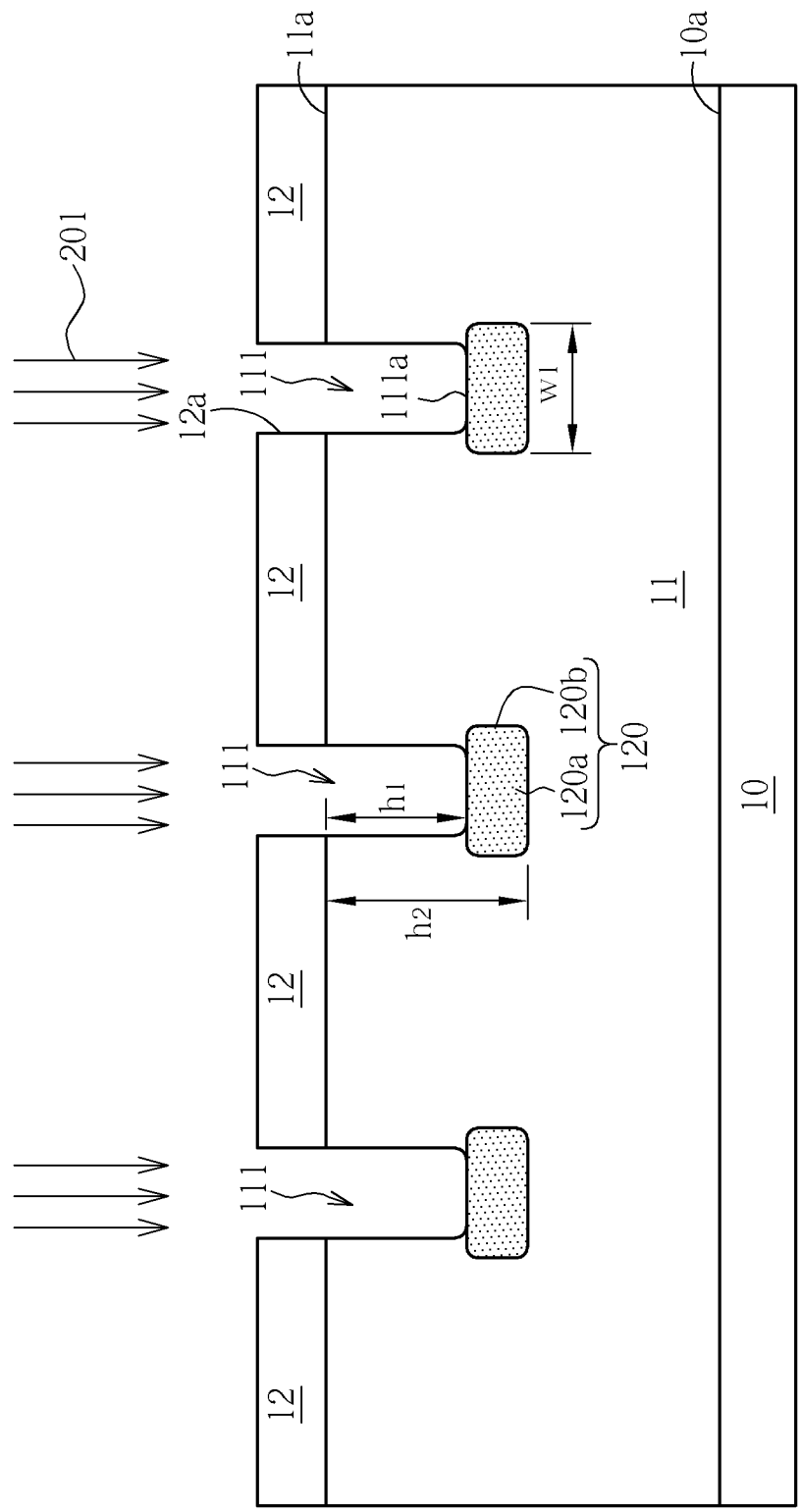

As shown in FIG. 2, a first trench etching process is performed to etch the semiconductor layer 11 through the opening 12a, thereby forming a first recess 111 having a depth $h_1$ below the surface 11a of the semiconductor layer 11. For example, the depth $h_1$ may range between ½-⅕ of the thickness of the semiconductor layer 11. Subsequently, a first ion implantation process 201 is performed to vertically implant dopants with a conductivity type that is opposite to that of the semiconductor layer 11 into the bottom 111a of the first recess 111 through the opening 12a, thereby forming a first doping region 120. It is noteworthy that the first ion implantation process 201 is performed vertically with respect to the main surface 10a of the semiconductor substrate 10, for example, at an ion implantation angle that is less than 5°. The first doping region 120 comprises a central doping region (or direct doping region) 120a and a scattered doping region (or secondary doping region) 120b. The scattered doping region 120b is formed due to scattered ions that travel and extend beyond the sidewalls of the first recess 111, thereby constituting extensions on both sides of the central doping region 120a. Therefore, due to scattering of the incident dopant ions, the lateral width $w_1$ of the first doping region 120 is slightly larger than the width $w_0$ of the opening 12a. In FIG. 2, the junction depth at the bottom of the first doping region 120 is denoted by $h_2$ (below the surface 11a of the semiconductor layer 11). Of course, it is understood that the aforesaid first ion implantation process 201 may comprise a plurality of ion implant steps or may comprise single ion implant step. In a case that the first ion implantation process 201 comprises a plurality of ion implant steps, the implant energy of each step may be different.

Figure 3:
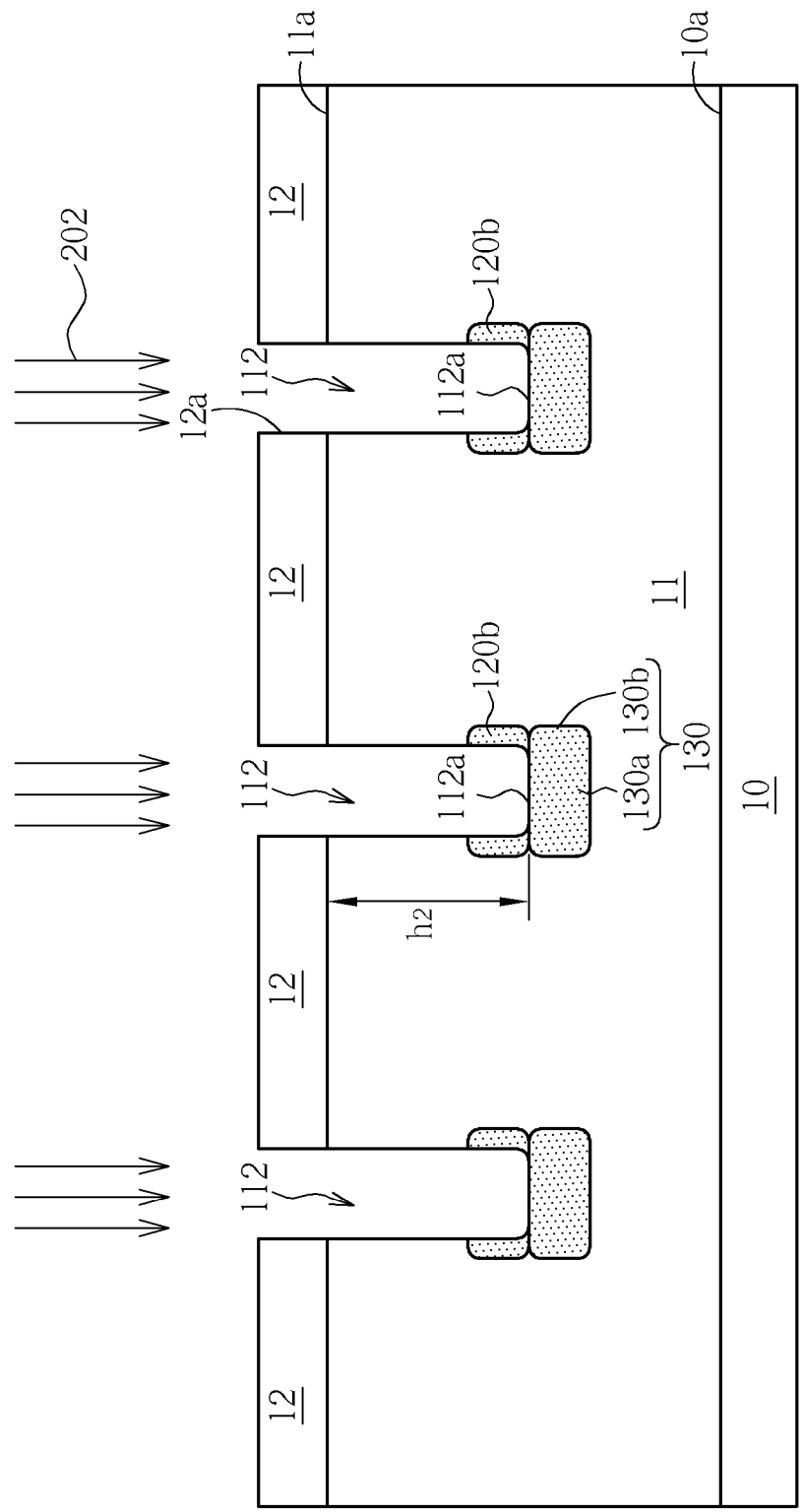

As shown in FIG. 3, a second trench etching process is performed to anisotropically etch the semiconductor layer 11 at the bottom 111a of the first recess 111 through the opening 12a, thereby forming a second recess 112 having a depth $h_2$. That is, the aforesaid second trench etching process etches through the first doping region 120 substantially to the junction depth of the first doping region 120, and the central doping region 120a is substantially removed, leaving the scattered doping region 120b intact on the lower sidewalls of the second recess 112. Subsequently, a second ion implantation process 202 is performed to vertically implant dopants with a conductivity type that is opposite to that of the semiconductor layer 11, such as N type dopants, into the bottom 112a of the second recess 112 through the opening 12a, thereby forming a second doping region 130. Likewise, the second doping region 130 comprises a central doping region 130a and a scattered doping region 130b. The scattered doping region 130b is formed due to scattered ions that travel and extend beyond the sidewalls of the second recess 112, thereby constituting extensions on both sides of the central doping region 130a.

Figure 4:
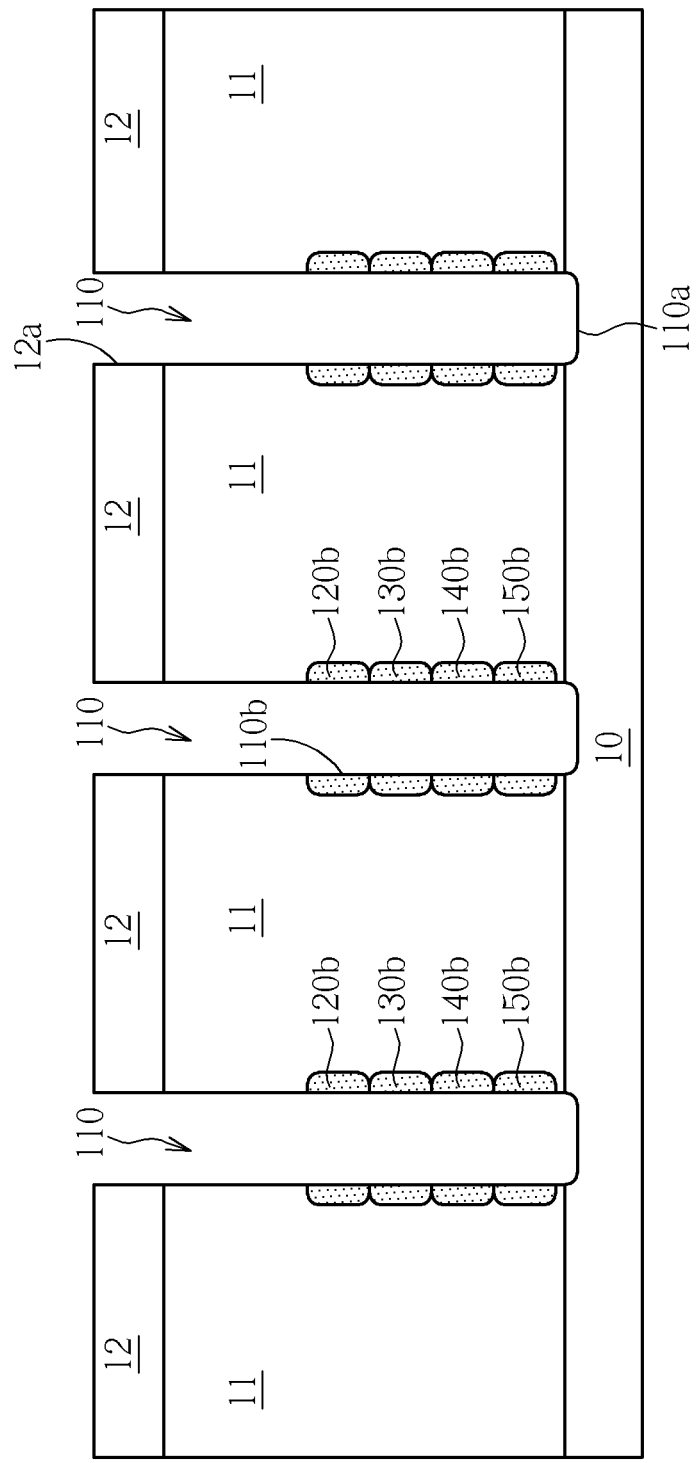

As shown in FIG. 4, after repeatedly performing the steps as set forth in FIGS. 2-3, a high aspect ratio deep trench 110 with a depth h below the surface 11a of the semiconductor layer 11 is formed in the semiconductor layer 11. According to the embodiment of the invention, the depth h of the deep trench 110 may be substantially equal to the thickness t of the semiconductor layer 11, but not limited thereto. According to the embodiment of the invention, the deep trench 110 has a bottom 110a and a vertical sidewall 110b. The bottom 110a may reveal a portion of the semiconductor substrate 10. After repeatedly performing the steps as set forth in FIGS. 2-3, a plurality of scattered doping regions 120b-150b are formed along the vertical sidewall 110b of the deep trench 110. The scattered doping regions 120b-150b are in close proximity to each other.

Figure 5:
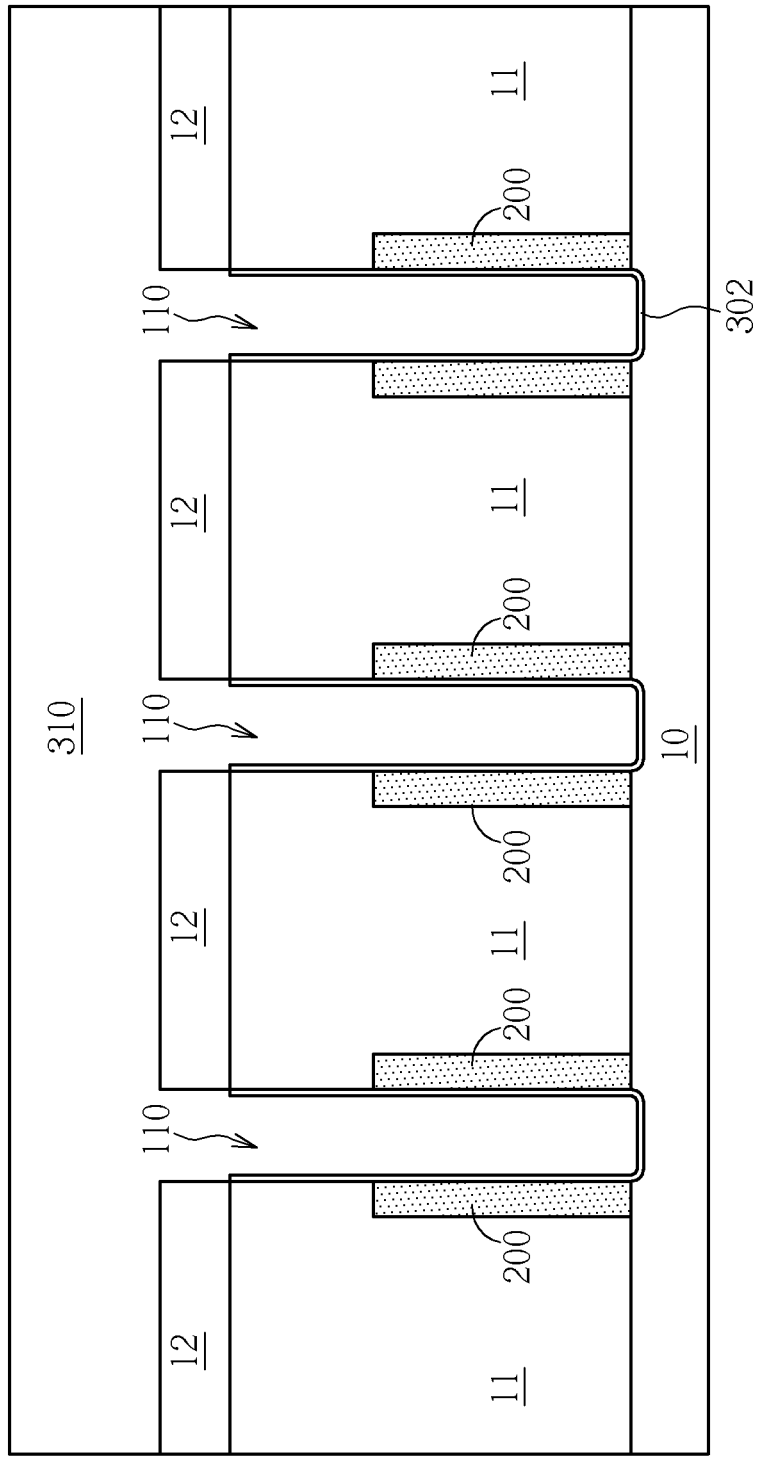

As shown in FIG. 5, a liner layer 302 is then formed on the vertical sidewall 110b and the bottom 110a of the deep trench 110. According to the embodiment of the invention, for example, the liner layer 302 may be a silicon oxide layer. According to the embodiment of the invention, the liner layer 302 may be a dielectric layer that may be formed by thermal oxidation methods, but not limited thereto. Thereafter, a chemical vapor deposition (CVD) process is carried out to deposit a trench fill dielectric layer 310 such as silicon oxide layer on the substrate in a blanket manner. The trench fill dielectric layer 310 fills the deep trench 110 and covers the hard mask pattern 12. A thermal drive-in process may be performed to form an $N^+$ sidewall drain doping region 200 that is electrically coupled to the semiconductor substrate 10.

Of course, it is understood that the deep trench 110 may be accomplished by merely performing the steps as set forth in FIGS. 2-3 in other embodiments. It is to be understood that the deep trench 110 is formed by performing multiple etching and ion implant steps according to this invention, wherein the number of the etching steps is no less than two. Further, the number of the etching steps may not be equal to the number of the ion implant steps. For example, in one embodiment, after performing the last etching step, an ion implant step after the last etching step may be omitted. Further, it is to be understood that the number of the ion implant steps right after each etching step may be more than one. In other words, between two successive etching steps, multiple ion implant steps may be performed. For example, after several times of ion implant from deep portion to shallow portion of the semiconductor layer, the central doping region is then removed. Furthermore, the thermal drive-in process may be performed after all of the ion implant steps are completed, or may be performed right after each ion implantation process.

Figure 6:
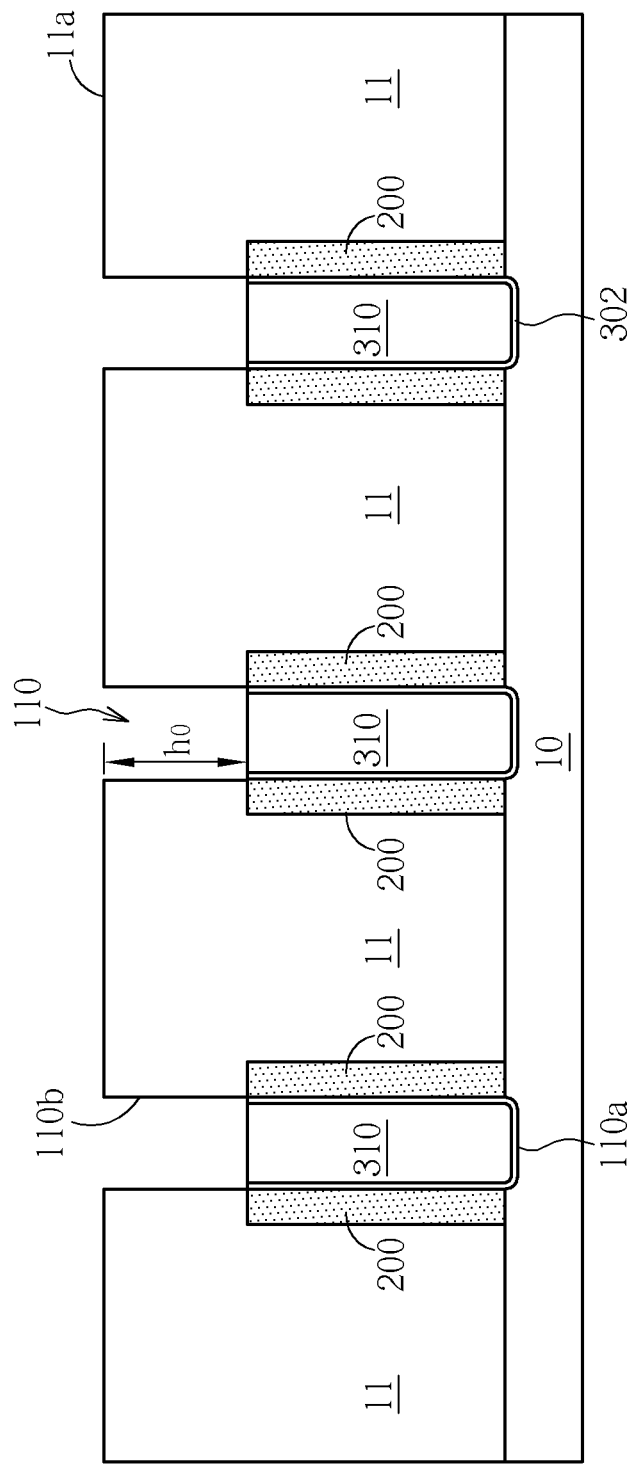
Figure 7:
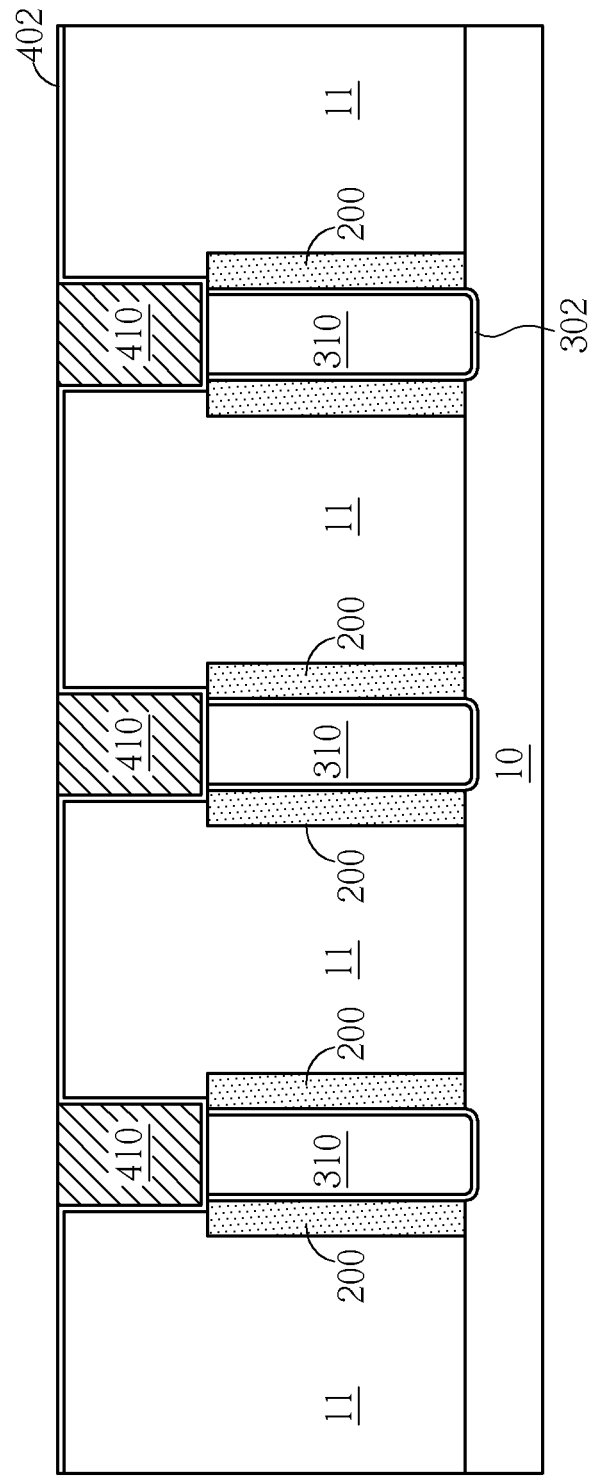
Figure 8:
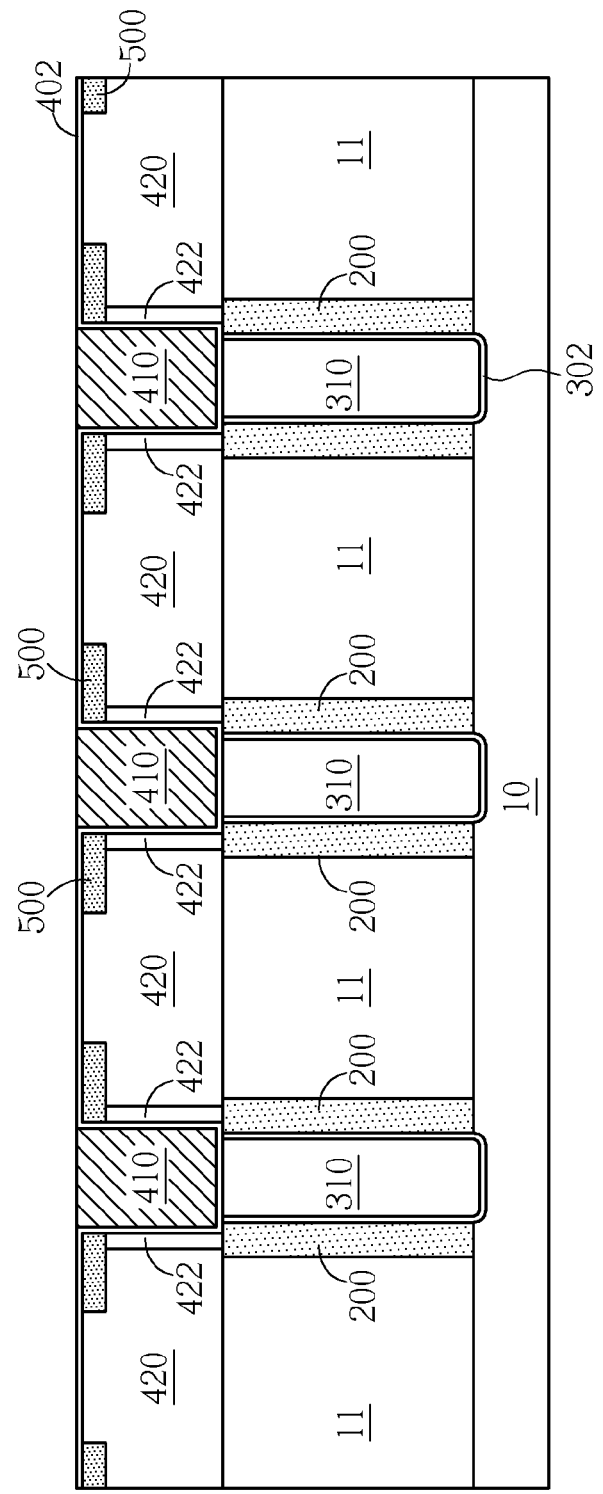

FIGS. 6-8 illustrate the process of making the trench gate transistor. As shown in FIG. 6, a chemical mechanical polishing (CMP) process is carried out to remove an upper portion of the trench fill dielectric layer 310 that is directly above the surface 11a of semiconductor layer 11 and the hard mask pattern 12 is revealed. Thereafter, the hard mask pattern 12 is removed and the trench fill dielectric layer 310 within the deep trench 110 is recessed to a predetermined depth $h_0$. The upper portion of the liner layer 302 is also removed to reveal the upper portion of the sidewall 110b. The surface 11a of the semiconductor layer 11 is also exposed. According to the embodiment of the invention, the predetermined depth $h_0$ is substantially equal to depth $h_1$. The remanent trench fill dielectric layer 310 covers the $N^+$ sidewall drain doping region 200. As specifically shown in FIG. 6, the top surface of the trench fill dielectric layer 310 is substantially flush with an upper edge of the N' sidewall drain doping region 200.

As shown in FIG. 7, on the exposed vertical sidewall 110b and the surface 11a of the semiconductor layer 11, a gate dielectric layer 402 such as a silicon oxide layer formed by oxidation is formed. Subsequently, a gate electrode 410 is formed within the deep trench 110. For example, the gate electrode 410 may be a polysilicon or metal electrode. To form the gate electrode 410, a polysilicon layer is deposited in a blanket manner, and then etched back to remove the portion of the polysilicon layer outside the deep trench from the P type semiconductor layer 11.

As shown in FIG. 8, an ion implantation process is performed to form a P well 420 in the semiconductor layer 11. An N⁺ source doping region 500 is then formed in the P well around the gate electrode 410 by ion implantation methods. A thermal drive-in process may be carried out to activate the dopants in the N⁺ source doping region 500. At his point, a vertical channel region 422 is defined between the N⁺ source doping region 500 and the N⁺ drain doping region 200 in the semiconductor layer 11.

Figure 9:
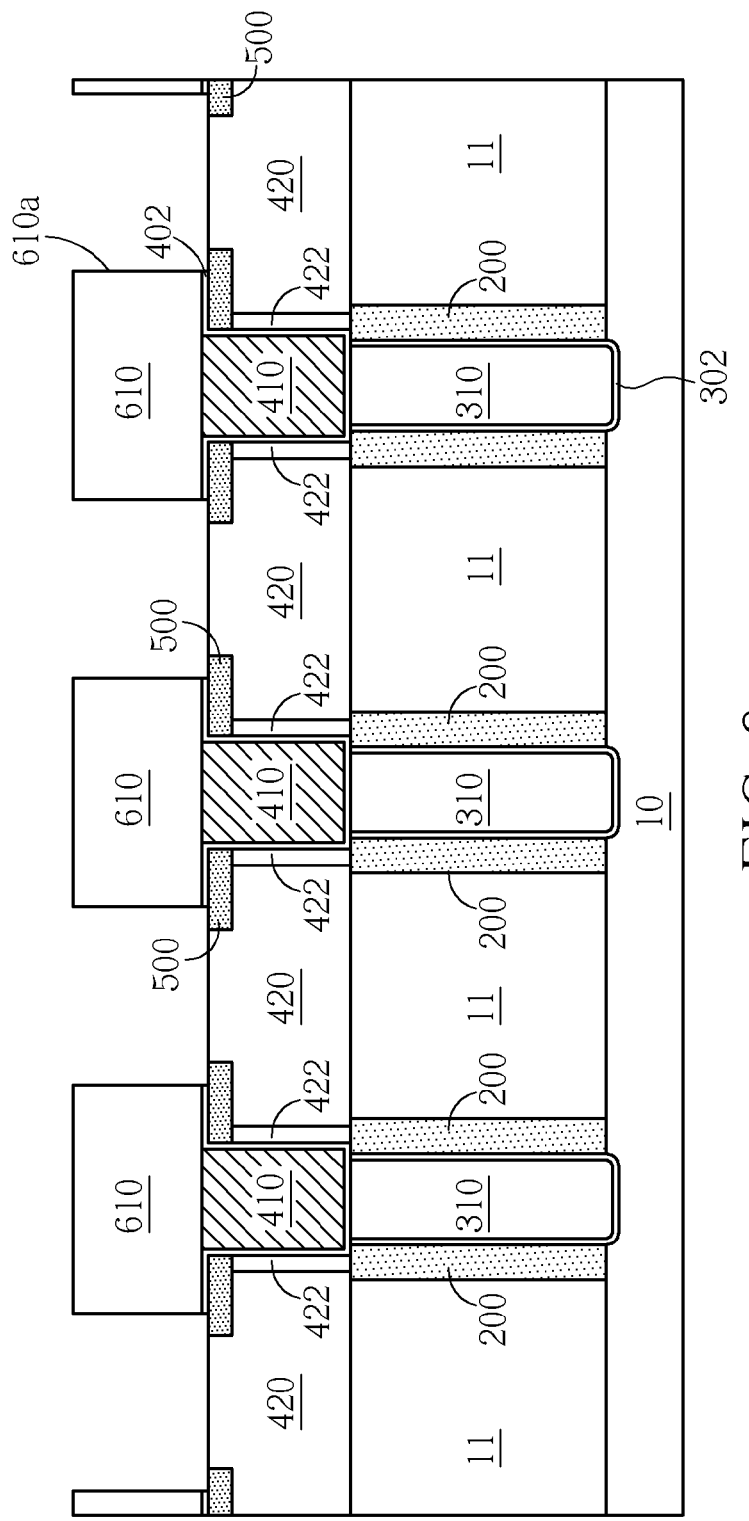
Figure 10:
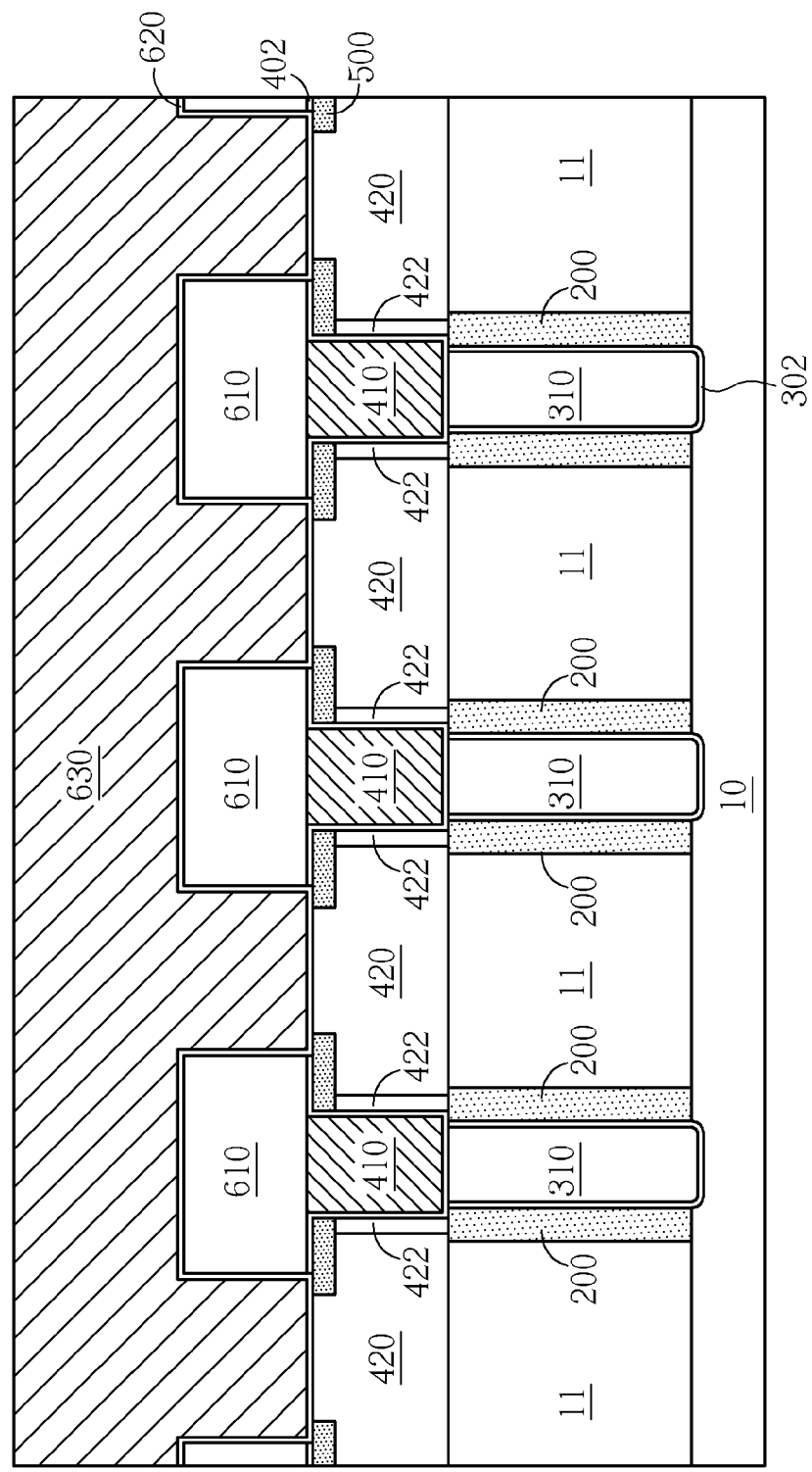

FIGS. 9-10 illustrate the process of making contact device. As shown in FIG. 9, a dielectric layer 610 is deposited in a blanket manner. A contact hole 610a is formed in the dielectric layer 610 by lithographic and etching processes. The contact hole 610a reveals a portion of the P well 420 and a portion of the N⁺ source doping region 500. An additional ion implantation process may be performed to implant dopants at an predetermined dose into the P well 420 through the contact hole 610a in order to reduce the contact resistance. Subsequently, as shown in FIG. 10, a barrier layer 620 is deposited on the substrate in a blanket manner. For example, the barrier layer 620 may comprise titanium and/or titanium nitride. A contact metal layer 630 is then deposited to fill the contact hole 610a.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a power semiconductor device, comprising:
   providing a substrate of a first conductivity type;
   forming a semiconductor layer of a second conductivity type on the substrate;
   forming a hard mask pattern on the semiconductor layer, the hard mask pattern having at least an opening exposing a portion of the semiconductor layer;
   performing a first etching, via the opening, to form a first recess in the semiconductor layer, wherein the first recess has a depth that is smaller than a thickness of the semiconductor layer;
   performing a first ion implantation process to vertically implant first dopants into a bottom of the first recess via the opening, thereby forming a first doping region wherein the first doping region is located within the semiconductor layer; and
   performing a second etching to etch through the first doping region, thereby forming a second recess extending through the first doping region, wherein a PN junction is formed between the first doping region and the semiconductor layer along a sidewall of the second recess.

2. The method for fabricating a power semiconductor device according to claim 1, wherein after forming the second recess, the method further comprises the step of:
   performing a second ion implantation process to form a second doping region at a bottom of the second recess.

3. The method for fabricating a power semiconductor device according to claim 1, wherein the first doping region comprises a central doping region and a scattered doping region.

4. The method for fabricating a power semiconductor device according to claim 3, wherein after etching through the first doping region, the scattered doping region is left on a lower sidewall of the second recess.

5. The method for fabricating a power semiconductor device according to claim 1, wherein the first dopants has a third conductivity type.

6. The method for fabricating a power semiconductor device according to claim 5, wherein the third conductivity type is opposite to the second conductivity type.

7. The method for fabricating a power semiconductor device according to claim 1, wherein the first conductivity type is opposite to the second conductivity type.

8. The method for fabricating a power semiconductor device according to claim 1, wherein the first conductivity type and the second conductivity type are the same conductivity type.

9. The method for fabricating a power semiconductor device according to claim 1, wherein after the first ion implantation process, a thermal drive-in process is performed.

10. The method for fabricating a power semiconductor device according to claim 1, wherein the first ion implantation process further comprises a plurality of ion-implant steps.

* * * * *